US010025205B2

(12) United States Patent
Zhu et al.

(10) Patent No.: US 10,025,205 B2
(45) Date of Patent: Jul. 17, 2018

(54) METHOD FOR DETECTING FOCAL PLANE BASED ON GRATING TALBOT EFFECT

(71) Applicant: The Institute of Optics and Electronics, The Chinese Academy of Sciences, Chengdu, Sichuan (CN)

(72) Inventors: Xianchang Zhu, Sichuan (CN); Song Hu, Sichuan (CN); Lixin Zhao, Sichuan (CN)

(73) Assignees: The Institute of Optics and Electronics, Chengdu, Sichuan (CN); The Chinese Academy of Sciences, Chengdu, Sichuan (CN)

( * ) Notice: Subject to any disclaimer, the term of this patent is extended or adjusted under 35 U.S.C. 154(b) by 173 days.

(21) Appl. No.: 14/865,081

(22) Filed: Sep. 25, 2015

(65) Prior Publication Data

US 2016/0091372 A1 Mar. 31, 2016

(30) Foreign Application Priority Data

Sep. 25, 2014 (CN) .......................... 2014 1 0500277

(51) Int. Cl.
  *G01B 11/02* (2006.01)
  *G03F 9/00* (2006.01)
  *G01B 9/02* (2006.01)
  *G02B 7/28* (2006.01)

(52) U.S. Cl.
  CPC ....... *G03F 9/7026* (2013.01); *G01B 9/02097* (2013.01); *G02B 7/28* (2013.01)

(58) Field of Classification Search
  CPC .................. G01B 9/02097; G02B 5/1842; G02B 5/1871; G02B 7/28; G01N 21/9501; G01N 21/956; G03F 9/7026
  See application file for complete search history.

(56) References Cited

U.S. PATENT DOCUMENTS

| 9,400,220 | B2* | 7/2016 | Zhu | ...................... G03F 9/7026 |
| 2010/0271636 | A1* | 10/2010 | Naoi | .................. G01B 9/02097 356/521 |
| 2014/0293275 | A1* | 10/2014 | Kato | .................. G01M 11/0257 356/124 |

* cited by examiner

*Primary Examiner* — Michael A Lyons
(74) *Attorney, Agent, or Firm* — Merchant & Gould P.C.

(57) ABSTRACT

The present disclosure relates to a method for detecting focal plane based on a grating Talbot effect, the function of which is to detect position of a silicon wafer in a photolithography machine in real time so as to implement an adjustment of leveling and foal plane of the silicon wafer in a high resolution. The detection system utilizes a phase change of "self-image" generated by a grating Talbot effect caused by defocusing of the silicon wafer, so as to accomplish the detecting for focal plane of the silicon wafer in the photolithography machine in a high resolution: if the silicon wafer is at a focal plane, the imaged wavefront by the grating is a planar wavefront; and when the silicon wafer is defocused, the imaged wavefront is a spherical wavefront. Such a detection system has a simple structure, a higher anti-interference capability and a perfect adaption of the process.

2 Claims, 2 Drawing Sheets

(a)

(b)

METHOD FOR DETECTING FOCAL PLANE BASED ON GRATING TALBOT EFFECT

This application claims benefit of Serial No. 201410500277.0, filed 25 Sep. 2015 in China and which application is incorporated herein by reference. A claim of priority is made to the above disclosed application.

TECHNICAL FIELD

The present disclosure relates to methods for detecting focal plane based on Grating Talbot Effect, which is applied for adjusting level and focus of a silicon wafer in a photolithography machine in a high accuracy and belongs to a field of microelectronic device and micro fabrication.

BACKGROUND

The microelectronic technique, the core of which is a large scale integrated circuit, is rapidly developed in a principle of "one generation of technique for one generation of apparatuses and one generation of devices". With appearance of nano-devices, there is provided new demands for the micro fabrication and micro- and nano-detection technique. An optical projection photolithography technique utilizes an optical projection theory to transfer a pattern from a mask to a silicon wafer in a high resolution by a projection objective lens. The optical projection photolithography technique has a high resolution for a contact-type photolithography and may avoid damaging and contaminating a mask. As the microfabrication technique with a widest application fields, rapidly updated technique and a strong viability, the optical projection photolithography technique is a core to drive the development of the microelectronic techniques and at present it is employed in most large scale integrated circuit In an optical projection photolithography machine, resolution and focal depth for the projection objective lens are key parameters affecting a projection and exposure system. The focal depth is drastically reduced with enhancement of the resolution of the photolithography machine. Meanwhile, in order to improve production efficiency of the projection photolithography machine, exposure areas of the silicon wafer are gradually increased. Thus, there is a new demand for the accuracy for adjusting the focal plane of the system by the photolithography machine with a high accuracy.

In a conventional projection and exposure photolithography machine, since the focal depth is long, the photolithograph machines mostly employ a technique for detecting the focus by CCD or PSD sensor. By imaging with a slot, a defocusing distance of a silicon wafer may be calculated by computing change of displacement of the slot in the detector. These two detecting methods have a simple measuring system and are easy to be operated; but they have a lower accuracy of measurement and can't meet the requirements of the photolithography on the detection of the focal plane in a higher accuracy.

With the enhancement of resolution of the photolithography system and the enlargement of the exposure visual field, the measuring system for adjusting leveling and the focal plane may further utilizes a multipoint measurement in which the height values at multiple points are measured to calculate amounts of inclination of the silicon, which is mainly used by a Japanese company of Nikon. An emergence light of a light source passes through an array of slots, is reflected by a surface of the silicon wafer and is imaged on the detector. When the silicon wafer is in an ideal state, the imaged light spot is located at the center of four-quadrant detector so that the light intensities in the four quadrants are identical. The detection system utilizes the array of slots to cover the whole exposure visual filed by scanning measurements. However, it is necessary to further optimize the algorithm for detection to improve the accuracy of measurement.

With the development of grating detection in the last century, a detection technique based on moiré fringe of a grating is applied to measurements for detecting focal plane in a projection photolithography system. If the relative positions of the grating and the detector is constant, the signal of the moiré fringe changes due to the change of position of the silicon wafer. Thus, the measurement of defocusing distance of the silicon wafer may be accomplished by measuring information about the change of the moiré fringes. Although such a method has a higher accuracy for detection, the system has a weak anti-interference capability and has a higher requirement for the environment.

In general, the currently reported method for detecting the focal plane has poor anti-interference capability and can't give attention to two or more things of the precision for detecting the focal plane and the efficiency. For the requirements of higher resolution for detecting the focal plane in the future projection photolithography machines, the present disclosure introduces a method for detecting the focal plane based on Grating Talbot Effect so as to meet the requirements of precisions and efficiency in the photolithography machines.

SUMMARY

The present disclosure provides a method for detecting focal plane based on a Grating Talbot Effect, which is applied to the adjustment of the leveling and focus of various types of photolithography machines.

The technical solution utilized by the present disclosure is shown as follows. The method for detecting focal plane based on a Grating Talbot Effect is implemented by a system for detecting focal plane constituted of a light source 1, a beam collimator and expander unit 2, a 4f optical system formed of a set of lens: Lens_1 and Lens_2, a measured silicon wafer 3, a diffraction grating 4 and a CCD detector 5. The set of lens (Lens_1 and Lens_2) form the 4f optical system. If the measured silicon wafer 3 is on a cofocal plane of the 4f system, an emergence planar wavefront of the beam collimating and expanding unit 2 is still a planar wavefront after passing through the 4f optical system, and a Talbot self-image is formed by itself through the diffraction grating 4; if the measured silicon wafer 3 is defocused, the emergence planar wavefront of the beam collimating and expanding unit 2 becomes a spherical wavefront after passing through the 4f optical system, the period and phase of the Talbot self-image formed by itself through the diffraction grating 4 are different. The measurements of the Talbot self-images for the planar wavefront and the spherical wavefront are accomplished by the CCD detector 5 so as to complete the measurement for detecting the focal plane of the silicon wafer.

The method for detecting focal plane is characterized by that when the measured silicon wafer 3 is located on the cofocal plane of the 4f system, the planar wavefront is imaged through the diffraction grating 4. Based on a grating diffraction principle, when the planar wavefront A is incident on the grating, a periodic interference fringe is formed in the CCD detector 5, i.e. the period for the Talbot self-image is identical to that (p) of the grating 4; when the measured silicon wafer 3 is defocused, an interference fringe caused by the spherical wavefront is generated in the CCD detector 5, and its period is represented by the following equation:

$$p_s = \frac{L-z}{L}p = p \pm s\frac{z}{f^2}p,$$

in which the grating 4 is located at a back focal plane of the set of lens Lens_2, L is a distance from a convergence center for the spherical wavefront to the grating, s is a defocusing distance of the silicon wafer, and f is a focal length of the set of lens Lens_2. The detection of the focal plane for the measured silicon wafer 3 in a high precision may be accomplished by measuring the periods and phase difference of the Talbot self-images of the grating 4.

The advantageous of the present disclosure over the prior at are shown as follows:

1) The method of the present invention utilizes a common Ronchi grating and a 4f optical system to accomplish the measurement for detecting focal plane of a silicon wafer, and has advantages such as a simple structure and a high anti-interference capability and so on.

2) By theoretical analysis, the defocus of the silicon wafer not only leads to difference in the period of the Talbot self-image, but also generates a corresponding phase changes, which may be processed by a corresponding phase analytical algorithm to obtain a higher precision for detecting the focal plane and has a higher industrial application.

BRIEF DESCRIPTION OF THE DRAWINGS

The method for detecting focal plane based on Grating Talbot Effect will be further illustrated in the accompany figures, the particular configuration of the measurement system and the measurement principle of which would be described in detail as follows by the accompany figures.

DETAILED DESCRIPTION

Figure 1:
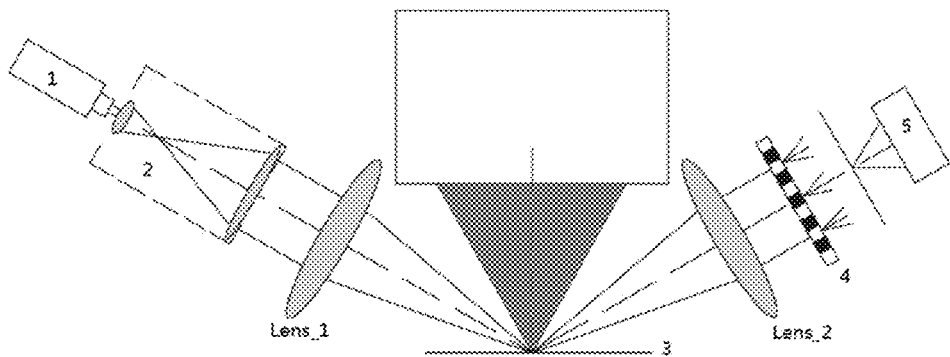
FIG. 1 is a schematic structural view of the system for detecting focal plane utilized by the method for detecting focal plane according to the present invention.

In order to implement an exact online measuring for detecting focal plane of a silicon wafer in a photolithography system, the present invention utilizes Grating Talbot Effect to accomplish such a measurement by analyzing a phase distribution of the interference fringes caused by the Talbot effect. The system for detecting focal plane is shows in FIG. 1.

The method for detecting focal plane based on a Grating Talbot effect in a photolithography machine with a high resolution is implemented by a system for detecting focal plane constituted of a light source 1, a beam collimator and expander unit 2, a 4f optical system formed of a set of lens: Lens_1 and Lens_2, a measured silicon wafer 3, a diffraction grating 4 and a CCD detector 5. The set of lens (Lens_1 and Lens_2) form the 4f optical system. If the measured silicon wafer 3 is on a cofocal plane of the 4f system, an emergence planar wavefront of the beam collimator and expander unit 2 is still a planar wavefront after passing through the 4f optical system, and a Talbot self-image is formed by itself through the diffraction grating 4; and if the measured silicon wafer 3 is defocused, the emergence planar wavefront of the beam collimator and expander unit 2 becomes a spherical wavefront after passing through the 4f optical system, the period and phase of the Talbot self-image formed by itself through the diffraction grating 4 are different. The measurements of the Talbot self-images for the planar wavefront and the spherical wavefront are accomplished by the CCD detector 5 so as to complete the measurement for detecting the focal plane of the silicon wafer.

The method for detecting focal plane is characterized by that when the measured silicon wafer 3 is located on the cofocal plane of the 4f system, the planar wavefront is imaged through the diffraction grating 4. Based on a grating diffraction principle, when the planar wavefront A is incident on the grating, a periodic interference fringe is formed in the CCD detector 5, i.e. the period for the Talbot self-image is identical to that (p) of the grating 4; and when the measured silicon wafer 3 is defocused, an interference fringe caused by the spherical wavefront is generated in the CCD detector 5, and its period is represented by the following equation:

$$p_s = \frac{L-z}{L}p = p \pm s\frac{z}{f^2}p,$$

in which the grating 4 is located at a back focal plane of the set of lens Lens_2, L is a distance from a convergence center for the spherical wavefront to the grating, s is a defocusing distance of the silicon wafer, and f is a focal length of the set of lens Lens_2. The detection of the focal plane for the measured silicon wafer 3 in a high precision may be accomplished by measuring the periods and phase difference of the Talbot self-images of the grating 4.

Figure 2:
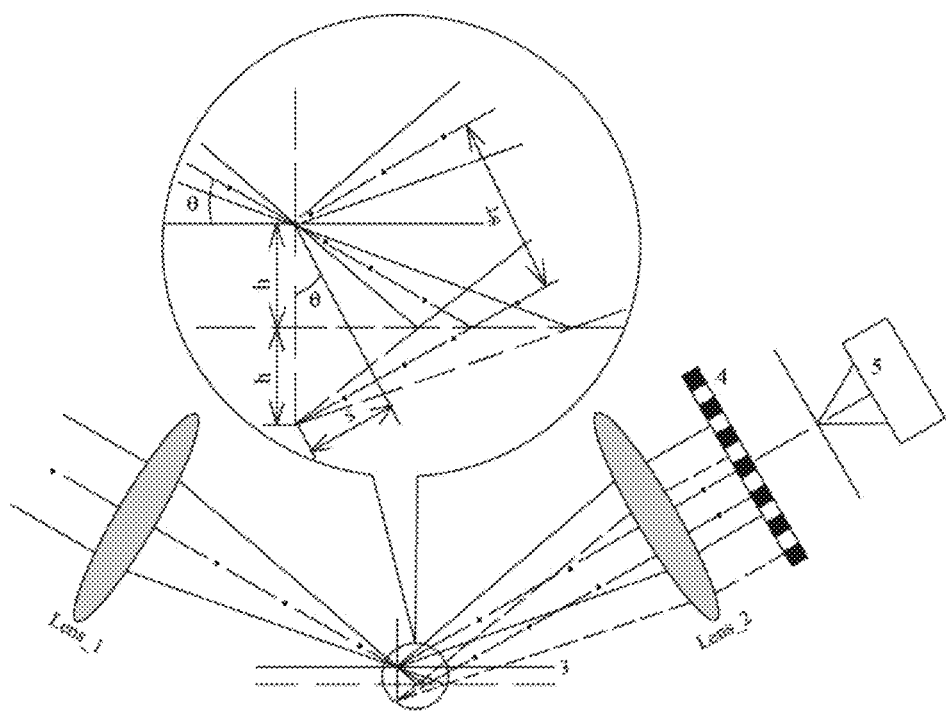
FIG. 2 is a schematic view of operation states of the system for detecting focal plane utilized in the method for detecting focal plane according to the present invention.

In particularly, when there is a defocused distance h for the silicon wafer, there are a defocused distance s along the axial direction and a defocused distance s⊥ perpendicular to the axis of the reflected wavefront of the measured silicon wafer 3 with respect to the set of lens (Lens_2), as shown in FIG. 2:

$$\begin{cases} s = 2h\sin\theta \\ s_\perp = 2h\cos\theta \end{cases}.$$

Due to defocusing of the silicon wafer, the emergence wavefront of the set of lens Lens_2 is a spherical wavefront, a center of curvature of which is represented as follows based on a Newton formula:

$$L = f^2/s.$$

In the detection system, a distance from the diffraction grating 4 and a back focal plane of the set of lens Lens_2 is ΔL. Since the defocusing distance for the silicon wafer is small, so L>>ΔL. According to optical diffraction theory, the phase distribution of the incidence wavefront of the grating 4 is expressed as follows:

$$U_1(x,y) = A\exp\left[-ik\frac{(x-2h\cos\theta)^2 + y^2}{L-\Delta L}\right] \approx A\exp\left[-ik\frac{(x-2h\cos\theta)^2 + y^2}{L}\right],$$

in which, θ is an angle between an optical axis of the detection system and a surface of the silicon wafer, A is an amplitude of the incidence wavefront, and k is a wave vector $2\pi/\lambda$.

The diffraction formula for the grating is expressed as follows:

$$g(x, y) = \sum c_n \exp\left(i2\pi \frac{nx}{p}\right) \; n = 0, \pm 1, \pm 2 \ldots,$$

in which, n is an order of the diffraction light of the grating, $c_n$ is a ratio of diffraction light intensity for respective orders, and p is a period of the grating. Since a duty ratio of the Ronchi grating is 50%, its even-order diffraction lights are absent, its third and higher order diffraction lights have weak light intensities, and the emergence wavefront of the diffraction grating 4 is composed of the zero$^{th}$ order and the ±first order of diffraction lights:

$$U_2(x, y) = c_0 A \cdot \exp\left[-ik\frac{(x - 2h\cos\theta)^2 + y^2}{2L}\right] +$$

$$c_1 A \cdot \exp\left[-ik\frac{(x - 2h\cos\theta)^2 + y^2}{2L} + ik\frac{\lambda}{p}x\right] +$$

$$c_1 A \cdot \exp\left[-ik\frac{(x - 2h\cos\theta)^2 + y^2}{2L} - ik\frac{\lambda}{p}x\right] =$$

$$c_0 A \cdot \exp\left[-ik\frac{(x - 2h\cos\theta)^2 + y^2}{2L}\right] +$$

$$c_1 A \cdot \exp\left[-ik\frac{\left(x - 2h\cos\theta \pm \frac{L\lambda}{p}\right)^2 + y^2}{2L} + ik\frac{L\lambda^2}{2p^2}\right].$$

Based on propagation principle for the spherical wave, when the distance z from the diffraction grating 4 and the CCD detector 5 is an integral multiple of the Talbot distance $z = mp/\lambda^2$, the phase distribution of the light wavefront on an image plane of the detector is expressed as:

$$U_f(x, y) = c_0 A \cdot \exp\left[-ik\frac{(x - 2h\cos\theta)^2 + y^2}{2(L - z)}\right] +$$

$$c_1 A \cdot \exp\left[-ik\frac{\left(x - 2h\cos\theta \pm \frac{L\lambda}{p}\right)^2 + y^2}{2(L - z)} + ik\frac{L\lambda^2}{2p^2}\right].$$

Figure 3:
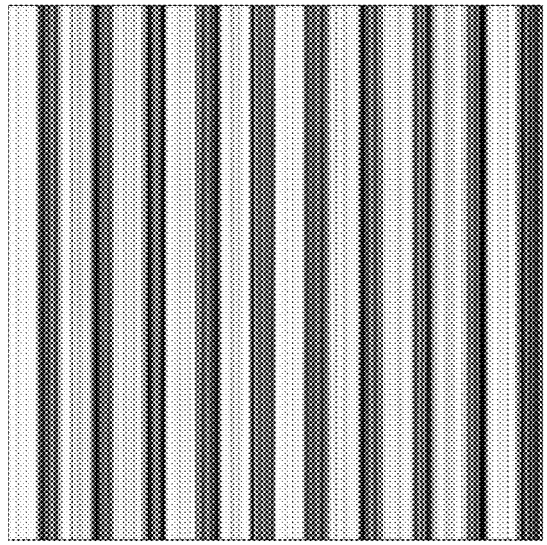
FIG. 3 shows Talbot self-images by a grating in the method for detecting focal plane according to the present invention, in which FIG. 3(*a*) shows a Talbot self-image of a spherical wavefront when the silicon wafer is defocused, and FIG. 3(*b*) shows a Talbot self-image of a planar wavefront when the silicon wafer is at the focal plane.
Figure 3:
Figure 3:
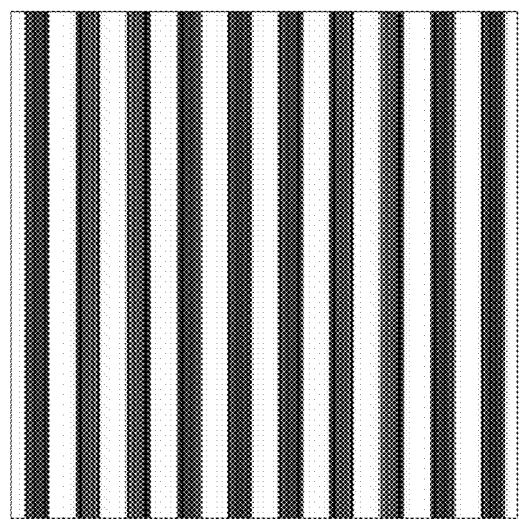
Figure 3:

It is indicated by a result of analysis that when the measured silicon wafer 3 is defocused a distance h, there appears a periodic interference fringes on the CCD detector, as shown in FIG. 3(a). The period of the fringe is expressed as:

$$p_s = \frac{L - z}{L} p.$$

When the measured silicon wafer is defocused a distance h equal to 0, the emergence wavefront of the diffraction grating 4 is similarly composed of the zero$^{th}$ order and the ±first order of diffraction lights:

$$U_2(x, y) = c_0 A + c_1 A \cdot \exp\left[-ik\frac{\lambda}{p}x\right] + c_1 A \cdot \exp\left[ik\frac{\lambda}{p}x\right]$$

It is indicated by a result of analysis that when the measured silicon wafer 3 is not defocused, the period of the interference fringes on the CCD detector 5 is identical to the period p of the grating. The measurement for detecting focal plane of the measured silicon may be accomplished by measuring the interference fringes, i.e. the phase change of the Talbot self-image of the grating.

In general, the method for detecting focus plane based on Grating Talbot Effect has advantages such as higher anti-interference capability, simple configuration, higher accuracy and efficiency, so it meets the requirements for photolithography machines in a high accuracy. The technique and principles which are not illustrated in detail in the present disclosure belongs to common knowledge in the art for those skilled in the art.

We claim:

1. A method for detecting focal plane based on Grating Talbot Effect, characterized by:
    a system for detecting focal plane constituted of a light source (1), a beam collimator and expander unit (2), a 4f optical system formed of a first set of lens (Lens_1) and a second set of lens (Lens_2), a measured silicon wafer (3), a diffraction grating (4) and a CCD detector (5),
    the first set of lens (Lens_1) and the second set of lens (Lens_2) form the 4f optical system:
        if the measured silicon wafer (3) is on a cofocal plane of the 4f system, an emergence planar wavefront of the beam collimator and expander unit (2) is still a planar wavefront after passing through the 4f optical system, and a Talbot self-image is formed by itself through the diffraction grating (4); and
        if the measured silicon wafer (3) is defocused, an emergence planar wavefront of the beam collimator and expander unit (2) becomes a spherical wavefront after passing through the 4f optical system, and period and phase of the Talbot self-image formed by itself through the diffraction grating (4) are changed, and the Talbot self-images for the planar wavefront and the spherical wavefront are measured by the CCD detector (5) so as to complete the measurement for detecting the focal plane of the silicon wafer.

2. The method for detecting focal plane according to claim 1, characterized by that
    when the measured silicon wafer (3) is located on the cofocal plane of the 4f system, an exit wavefront of the 4f system is a planar wavefront; based on a grating diffraction principle, when the planar wavefront is incident on the diffraction grating (4), a periodic interference fringe, a period of which is a period for the Talbot self-image and is identical to that (p) of the diffraction grating (4), is formed in the CCD detector (5); and
    when the measured silicon wafer (3) is defocused, an exit wavefront of the 4f system is a spherical wavefront, an interference fringe caused by the spherical wavefront is generated in the CCD detector (5), and Its period is represented by the following equation:

$$p_s = \frac{L - z}{L} p = p \pm s \frac{z}{f^2} p,$$

in which the diffraction grating (4) is located at a back focal plane of the second set of lens (Lens_2), $p_s$ is the period of the interference fringe caused by the spherical wavefront, L is a distance from a convergence center for the spherical wavefront to the diffraction grating (4), z is a distance from the diffraction grating to the CCD detector, p is a cycle of the diffraction grating, s is a defocusing distance of the silicon wafer, and f is a focal length of the second set of lens (Lens_2), the detection of the focal plane for the measured silicon wafer (3) in a high precision is accomplished by measuring changes of the periods and phase of the Talbot self-images of the diffraction grating (4).

\* \* \* \* \*